United States Patent [19]

Pang et al.

[11] Patent Number: 5,179,538
[45] Date of Patent: Jan. 12, 1993

[54] MEMORY SYSTEM INCLUDING CMOS MEMORY CELLS AND BIPOLAR SENSING CIRCUIT

[75] Inventors: Roland Pang, Bellevue; John Y. Chen, Issaquah, both of Wash.

[73] Assignee: The Boeing Company, Seattle, Wash.

[21] Appl. No.: 373,948

[22] Filed: Jun. 30, 1989

[51] Int. Cl.$^5$ .................... G11C 7/06; G11C 11/407
[52] U.S. Cl. .................... 365/207; 365/177; 365/179; 365/189.09; 365/230.05
[58] Field of Search .............. 365/190, 205, 207, 208, 365/154, 156, 177, 179, 155, 174, 210, 230.05, 189.09, 189.02, 230.02, 225.6; 307/355, 362, 530, 562

[56] References Cited

U.S. PATENT DOCUMENTS

| | | | |
|---|---|---|---|
| 4,099,070 | 7/1978 | Reinert | 307/238 |
| 4,099,266 | 7/1978 | Biggers | 365/208 |
| 4,196,363 | 4/1980 | Malaviya | 307/362 |
| 4,386,420 | 5/1983 | Ong | 365/208 |
| 4,464,735 | 8/1984 | Toyoda et al. | 365/155 |
| 4,553,053 | 11/1985 | Ong et al. | 307/530 |
| 4,598,389 | 7/1986 | Duvvury et al. | 365/208 |
| 4,724,344 | 2/1988 | Watanabe | 307/530 |
| 4,742,488 | 5/1988 | Wong | 365/189 |
| 4,780,847 | 10/1988 | Ito | 365/154 |
| 4,791,616 | 12/1988 | Taguchi et al. | 365/205 |
| 4,792,924 | 12/1988 | Rubinstein | 365/154 |
| 4,800,529 | 1/1989 | Veno | 365/208 |
| 4,802,138 | 1/1989 | Shimamune | 365/210 |
| 4,806,792 | 2/1989 | Simmons | 307/357 |
| 4,853,898 | 8/1989 | Hashemi et al. | 365/190 |
| 4,858,183 | 8/1989 | Scharrer et al. | 365/177 |

FOREIGN PATENT DOCUMENTS

| | | | |
|---|---|---|---|
| 0011448 | 5/1980 | European Pat. Off. | 365/182 |
| 0140235 | 5/1985 | European Pat. Off. | 365/182 |
| 61-13500 | 1/1986 | Japan | 365/182 |
| 1280450 | 1/1986 | U.S.S.R. | 365/182 |

OTHER PUBLICATIONS

Terman, L. M., "FET Memory Systems," *IEEE Transactions On Magnetics*, vol. Mag-6, No. 3, Sep. 1970, pp. 584-589.

*Primary Examiner*—Joseph L. Dixon
*Assistant Examiner*—Jack A. Lane
*Attorney, Agent, or Firm*—Christensen, O'Connor, Johnson & Kindness

[57] ABSTRACT

A memory system (10) is disclosed including a memory array (14), decoder circuit (16), and sensing circuit (17). The memory array includes a plurality of two-port CMOS memory cells (42) arranged in columns and rows that are selectively addressed by the decoder circuit. The bipolar sensing circuit responds to data stored in an addressed memory cell in the following manner. A column decoder (28) in the decoder circuit provides information to a source select multiplexer (30) and a column read access port (18) to selectively couple information stored in the memory cell to an output stage (20). At the output stage a comparison is made between the stored data and a reference voltage provided by a threshold circuit (38) to produce an output indicating the sensed level. The memory cells are preferably asymmetrically designed for hysteretic operation. The resultant bipolar/CMOS memory system advantageously combines the attributes of high density, high speed, and low power consumption.

7 Claims, 4 Drawing Sheets

_Fig. 4._

_Fig. 5._

Fig. 6.

MEMORY SYSTEM INCLUDING CMOS MEMORY CELLS AND BIPOLAR SENSING CIRCUIT

FIELD OF THE INVENTION

This invention relates generally to memory systems and, more particularly, to memory cells and sensing circuits included in such systems.

BACKGROUND OF THE INVENTION

Memory systems are universally employed in digital processing systems for several purposes. For example, the memory system may store program instructions that control the operation of a central processing unit (CPU) included in the digital processing system. In addition, the memory system typically stores information that is received and processed by the CPU.

Memory systems are classified, in part, by the way in which information is provided to, and retrieved from, the system. For example, memory systems are often described as providing random-access memory (RAM), read-only memory (ROM), or programmable read-only memory (PROM). RAM is so named because information can either be written into or read out of various sections of the memory at random. ROM contains information that is typically input by the manufacturer of the memory system and is designed only to be read. The information stored in PROM is also designed primarily to be read from the memory but can also be written into by a process that is more complex and slower than the conventional writing process in RAM.

A conventional memory system coupled to a CPU includes a number of components. In that regard, data storage is accomplished by a plurality of memory cells arranged into a memory array. Each memory cell is designed to store a single binary digit, or bit, of data in the form of a voltage having one of two levels. These levels are conventionally designated "logic one" and "logic zero".

Memory cells are classified in several different ways. For example, memory cells may be either dynamic or static. A dynamic memory cell is a relatively simple device, typically including a single capacitive element that stores the bit of data. The disadvantage with dynamic memory cells is that they retain information for only a limited time. Thus, the bit of data must be periodically reapplied to the memory cell if the information is to be retained.

Static memory cells are more complex than dynamic cells and typically include a plurality of semiconducting elements. These elements cooperatively retain data applied to the cell for extended intervals without being refreshed. As a result, the increased memory cell complexity allows simpler support circuits to be employed.

The memory cells are arranged into a plurality of columns and rows that define the memory array, with each cell corresponding to a different location in the array. Information is written into and read from particular locations in the array by the CPU, in cooperation with the remaining components of the memory system. These components include a write circuit and a read or sensing circuit.

Of the two, the write circuit is simpler. More particularly, the write circuit includes a decoder that transfers data from the CPU to the memory cell. This typically involves enabling the cells in the row of the array in which the select memory cell is located. Then data is applied to the column in which the select memory cell is located. Because the select memory cell is the only one enabled in that column, it receives and stores the data. No additional processing of the data is generally required.

In contrast, the sensing circuit is more complex. Like the write circuit, a sensing circuit must include a decoder for selectively coupling the CPU to particular locations in the array. In addition, the sensing circuit must be designed to properly interpret the information stored in a given memory cell. In that regard, most memory cells store information as low-level electrical signals. As a result, this information can be easily misinterpreted if subject to noise or compared to loosely toleranced reference signals. The low-level signals stored in memory are also likely inadequate to operate downstream circuits. As a result, the sensing circuit must ensure that the information is sufficiently amplified for proper interpretation when received at the CPU.

Conventional sensing circuits are commonly either of differential or single-ended construction. Differential sensing circuits include a pair of lines coupled to the memory cells. One line is identified as a "read bit line" (RBL), while the other line is its complement, identified as a "not read bit line" ($\overline{\text{RBL}}$).

As noted previously, memory cells typically store information in the form of relatively low-level electrical signals, which are particularly susceptible to misinterpretation caused by noise. The differential comparison of complementary outputs reduces the impact of noise, by doubling the signal range available, and effectively makes the circuit self-referencing. As a tradeoff, however, differential arrangements are relatively complex and consume precious space in integrated circuit designs.

Single-ended sensing circuits, as their name suggests, have a single read bit line (RBL) coupled to a given memory cell. Thus, integrated circuit space is conserved. Because single-ended sensing circuits may not be self-referencing, however, some reference mechanism must be provided to improve noise immunity, thereby increasing circuit complexity.

These various components of memory systems can be produced by a number of semiconductor technologies. For example, complementary metal-oxide semiconductor (CMOS) transistors have been employed in the design of memory arrays. MOS devices typically require relatively little semiconductor space and dissipate little power in an integrated circuit and are thus useful in forming memories by large-scale integration techniques. CMOS devices have also been used in sensing circuits. Because CMOS transistors are not generally drivable at high current levels, however, they are not particularly well suited for that application.

Bipolar transistors have also been used for memory arrays and sensing circuits. In contrast to MOS devices, bipolar transistors consume a relatively large amount of space and power in an integrated circuit. Where a large memory capacity is required, this constraint may be unacceptable, precluding the use of bipolar devices in the memory array. Because a comparatively small number of devices are employed in the sensing circuit, however, the high drivability of bipolar transistors makes them well suited for that application.

While a number of memory cells and sensing circuits have been developed in the past, it remains desirable to develop an arrangement that consumes less circuit space and power, more reliably interprets data, and allows data to be accessed more rapidly.

SUMMARY OF THE INVENTION

In accordance with this invention, a bipolar sensing circuit is provided for use in reading information stored in an array of memory cells having columns and rows. The sensing circuit includes a plurality of column read transistors having base, collector, and emitter terminals. The base terminals of the column read transistors are coupled to separate columns of the memory array, and the column read transistors are for transferring information from a select memory cell located in the column that the column read transistor is coupled to. The sensing circuit also includes an output transistor having base, collector, and emitter terminals. The emitter terminal of the output transistor is coupled to the emitter terminal of each column read transistor. The column read transistor couples information to the output transistor. The resultant configuration has a very high circuit density.

In accordance with another aspect of this invention, a memory cell is provided having asymmetric components for operation in a hysteretic manner. As a result, the cell draws less current during the write opertion and allows more current to be drawn during the read operation. In addition, a threshold circuit is provided to produce a reference voltage that is established in part by mimicking a portion of the sensing circuit and a cell read current produced in a selected memory cell to improve memory speed.

BRIEF DESCRIPTION OF THE DRAWINGS

The invention will presently be described in greater detail, by way of example, with reference to the accompanying drawings, wherein.

DETAILED DESCRIPTION OF THE PREFERRED EMBODIMENT OF THE INVENTION

Figure 1:
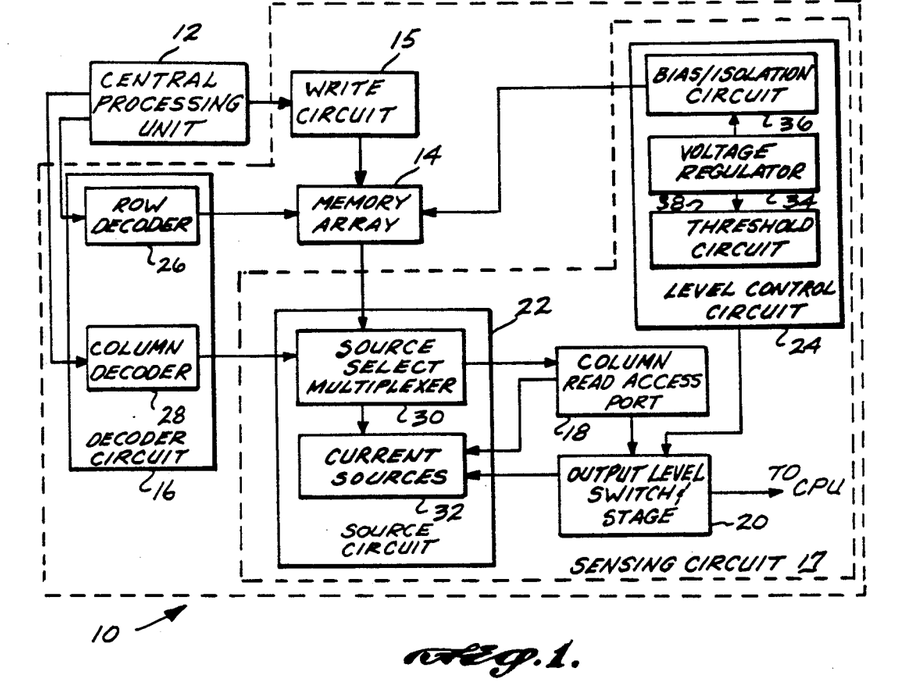
FIG. 1 is a block diagram of a memory system constructed in accordance with this invention.

Referring now to FIG. 1, a memory system 10 constructed in accordance with the invention is shown in block form. Memory system 10 stores information for use by a central processing unit (CPU) 12 in the performance of a variety of tasks. The memory system 10 and CPU 12 are typically incorporated as part of a broader computer system, instrument, or appliance.

Reviewing the components of memory system 10 in slightly greater detail, as shown in FIG. 1, memory system 10 includes seven separate subsystems or blocks. A memory array 14 is included to store the information used by CPU 12. The particular location in array 14 that CPU 12 wishes to write data into is accessed by a write circuit 15. The location in array 14 that CPU 12 wishes to read data from, on the other hand, is accessed by a decoder circuit 16 cooperatively acting with a sensing circuit 17 that includes column read access ports 18. An output stage 20 is coupled to the memory array 14 via the column read access ports 18, and signals to CPU 12 the information stored at the select location within memory array 14. Finally, a current source circuit 22 and voltage level control circuit 24 cooperatively establish the current and voltage levels required to operate array 14, column read access ports 18, and output stage 20.

Reviewing several of these blocks in greater detail, the array 14 includes a plurality of memory cells arranged into rows and columns. Each cell provides a memory location for the storage of data. Although not illustrated in FIG. 1, the write circuit 15, which is of conventional design, includes a decoder that selectively accesses the cells in array 14.

The decoder circuit 16 includes a row decoder 26 and column decoder 28 that cooperatively respond to instructions by CPU 12 to access a particular location in memory array 14. As represented in FIG. 1, the row decoder 26 is coupled directly to the rows of array 14. Although not illustrated in detail, the row decoder 14 may include both CMOS and bipolar transistors. The various columns of array 14 are accessed by the cooperative action of the column decoder 28, column read access ports 18, and source circuit 22, as described in greater detail below. In the preferred arrangement, the column decoder 28 includes bipolar devices arranged in an emitter-coupled logic configuration for fast operation.

The current source circuit 22 includes a source select multiplexer 30 and current sources 32. The source select multiplexer 30 responds to inputs from the column decoder 28 to couple the various columns of array 14 and the column read access ports 18 to different current sources 32, depending upon whether or not the columns include the location from which information is to be read. The current sources 32, in turn, draw current through the various columns of array 14, as well as from the output stage 20.

The level control circuit 24 also includes several elements. A voltage regulator 34 provides a regulated source voltage $V_{BG}$ used by the system 10. A bias/isolation circuit 36; coupled to voltage regulator 34, generates an offset voltage $V_{BLOS}$ that properly biases the read bit lines of the memory array 14, while isolating it from noise in the system rail voltages. A threshold circuit 38 is also coupled to voltage regulator 34 to provide a threshold voltage $V_{RTH}$ for use by output stage 20 in quickly determining the status of information stored in a select location of array 14.

As outlined above, column read access ports 18, output level stage 20, current source circuit 22, and level control circuit 24 define a sensing circuit 17. The collective function of sensing circuit 17 is to quickly and accurately interpret information stored in a select location of array 14. Sensing circuit 17 further provides an output whose level is suitable for use by CPU 12. Sensing circuit 17 is also designed to require a relatively small amount of semiconductor chip space in comparison with other bipolar sensing circuits.

Figure 2:
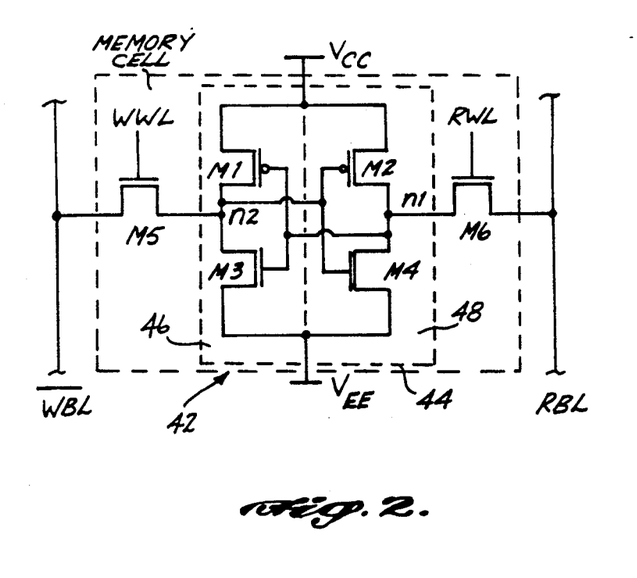
FIG. 2 is a schematic diagram of a six-transistor, two-port CMOS memory cell employed in the system of FIG. 1.

Referring now to FIG. 2, a six-transistor, two-port CMOS memory cell 42 of the type contemplated for use in array 14 is shown. Cell 42 includes a flip-flop 44 for storing bits of information to be written into, or read from, the cell 42. The flip-flop 44 includes two cross-coupled inverters 46 and 48 formed by CMOS transistors M1, M2, M3, and M4. CMOS transistors M5 and M6 form a cell write access port and cell read access port, respectively.

Transistors M1 and M2 are p-channel devices, while transistors M3, M4, M5 and M6 are n-channel devices. Thus, for purposes of discussion, transistors M1 and M2 conduct current between their source and drain terminals when low logic level signals are applied to their gate terminals. In contrast, transistors M3, M4, M5, and M6 conduct current between their source and drain terminals only when high logic level signals are applied to their gate terminals.

Addressing now the manner in which data is written into and read from the memory cell 42, each cell includes one line for enabling the write operation (write word line WWL), one line for enabling the read operation (read word line RWL), one line for transferring data into cell 42 (not write bit line $\overline{WBL}$), and one line for transferring data out of the cell (read bit line RBL). Thus, to write data into cell 42, a signal is communicated from write circuit 15 to cell 42 along the write word line WWL. More particularly, a high logic level signal is applied on line WWL to the gate terminal of transistor M5, turning it on.

The logic complement of the data to be written into memory cell 42 is then provided on the not write bit line ($\overline{WBL}$) to the source terminal of transistor M5. So, if a zero bit is to be stored in memory cell 42, a one bit is conducted on the not write bit line $\overline{WBL}$, through transistor M5, to the gate of transistor M4, turning it on and bringing the output node n1 down to the low rail voltage ($V_{EE}$). The logic one bit applied to the gate of transistor M4 is also applied to the gate terminal of the p-channel transistor M2, turning transistor M2 OFF. The low-level signal at the output node n1 is applied to the gate of transistor M3 and the gate of transistor M1, maintaining these transistors OFF and ON, respectively, and completing the latch. The logic zero signal present at node n1 can then be read from memory cell 42 via the transistor M6 and the read bit line RBL, as discussed below.

As will be appreciated, if a logic one bit is to be written into memory cell 42, the write word line WWL again is held high, while a zero bit is applied to the not write bit line $\overline{WBL}$. The low signal on the not write bit line $\overline{WBL}$ is passed by transistor M5 to the gate of transistor M4 and the gate of transistor M2. As a result, transistor M2 is ON and transistor M4 is OFF, bringing the output node n1 high. This high level at node n1 is applied to the gate terminal of transistor M3 and the gate terminal of transistor M1, maintaining these transistors ON and OFF, respectively, to complete the latch. The logic one level at node n1 is also available to be read out of memory cell 42 in the following manner.

When the information stored in memory cell 42 is to be read, a high logic signal is first applied to the gate terminal of transistor M6 via the read word line RWL. As a result, transistor M6 turns on, conducting the logic bit present at the output node n1 to the read bit line RBL for interpretation by the sensing circuit.

As previously noted, the memory array 14 includes a plurality of memory cells 42 constructed in this manner. The cells 42 are arranged in columns and rows that define the array 14. In the arrangement shown in the FIG. 3, the memory array 14 includes four memory cells designated 50, 52, 54, and 56. As shown, memory cells 50 and 52 form a first row of the array 14, while memory cells 54 and 56 form a second row. Memory cells 50 and 54, in turn, define a first column of array 14, while memory cells 52 and 56 define a second column.

Figure 3:
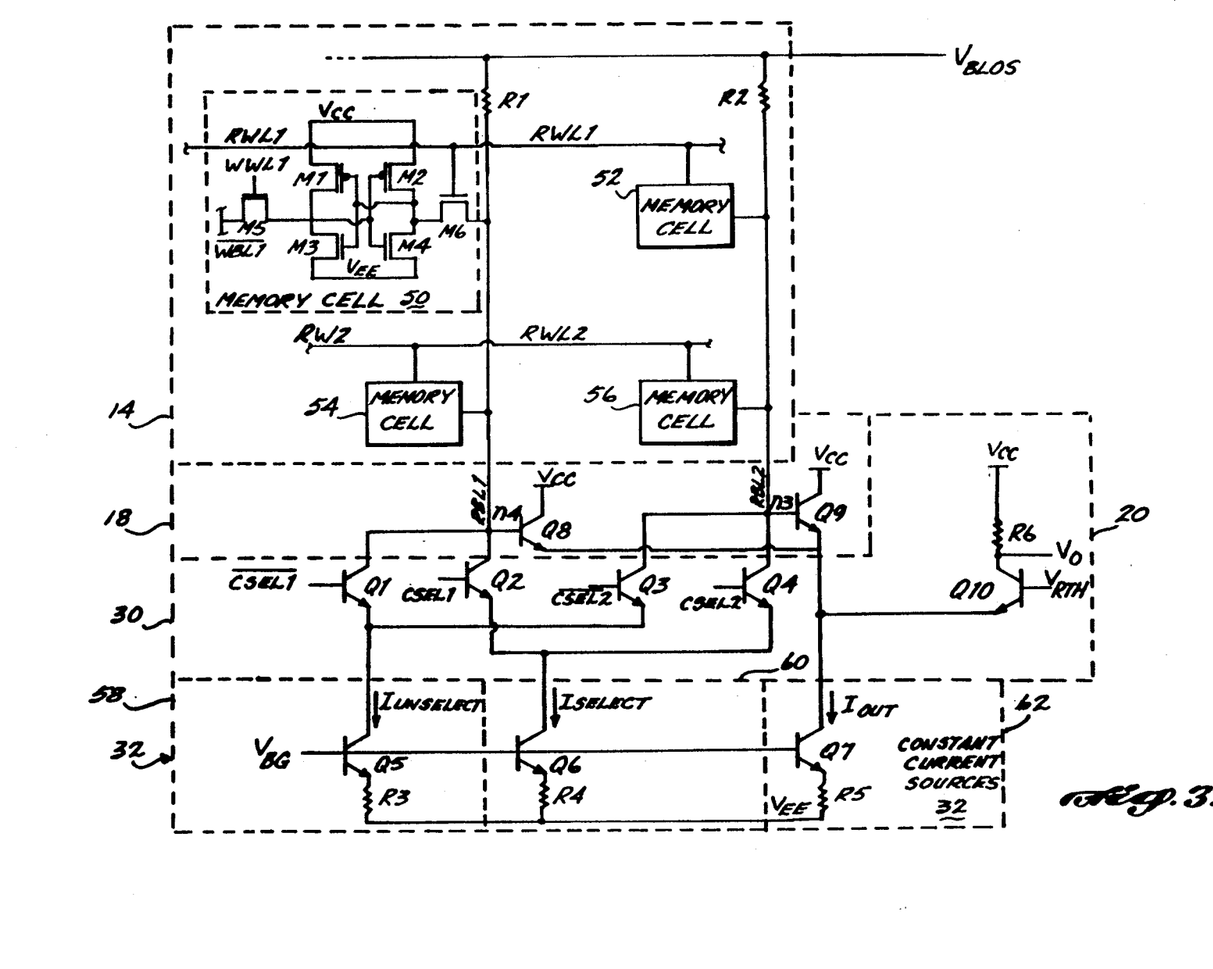
FIG. 3 is a schematic diagram of several components of the system o FIG. 1, including an array of memory cells of the type illustrated in FIG. 2 and components for sensing the data stored in the memory cells.

Addressing more particularly the manner in which the various memory cells are connected to form array 14, the write word lines WWL of cells 50 and 52 in row one are connected together, as are lines WWL of the cells 54 and 56 in row two. The same is true of the read word lines RWL for cells 50 and 52 in row one and cells 54 and 56 in row two. Thus, a logic one input to the write word line WWL or read word line RWL for any given row enables the write or read operation for each cell in the row simultaneously.

With respect to the column connections of the various cells, the not write bit lines $\overline{WBL}$ of cells 50 and 54 in column one are connected together, as are the not write bit lines $\overline{WBL}$ of the cells 52 and 56 in column two. Similarly, the read bit lines RBL of the cells 50 and 54 in column one, and the lines RBL of cells 52 and 56 in column two, are connected together. As a result, circuits coupled to the not write bit line $\overline{WBL}$ or read bit line RBL of a given column are able to draw information provided to the line by any of the cells in the column. A resistor R1 also couples the read bit line RBL1 of column one to the bias/isolation circuit 36, while a resistor R2 couples the read bit line RBL2 of column two to the bias/isolation circuit 36.

As will be appreciated, in the array 14 of FIG. 3, only four cells are shown for illustrative purposes. In a conventional array 14, however, a large number of cells 42 would be employed. Compared to bipolar technology, the use of CMOS technology for the cells 42 allows each cell 42 to consume a relatively small amount of integrated circuit space. As a result, large-scale memories can be provided on a single chip.

Having reviewed the construction of memory array 14, the various components of sensing circuit 17 will now be discussed. As depicted in FIG. 3, these components are largely of a bipolar construction. Although bipolar devices consume more circuit space than CMOS devices, the use of bipolar devices in the sensing circuit 17 does not unduly limit circuit integration levels because relatively few devices are required in comparison to memory array 14. In addition, bipolar devices are well suited for use in sensing circuit 17 because they are operable at higher current levels.

Addressing the various components of sensing circuit 17 individually, the source select multiplexer 30 includes four bipolar transistors Q1, Q2, Q3, and Q4. As shown in FIG. 3, the emitters of transistors Q1 and Q3 are coupled together. The collector of transistor Q1 is connected to the read bit line RBL1 of column one, while the collector of transistor Q3 is connected to the read bit line RBL2 of column two.

The bases of transistors Q1 and Q3 are connected to the column decoder 28 and receive the logic inverse or complement of signals indicating whether the memory cell to be read is in column one or two, respectively. As shown in FIG. 3, these signals are represented by $\overline{CSEL1}$ and $\overline{CSEL2}$. Thus, if column one contains the memory cell to be read, the not column one select signal $\overline{CSEL1}$ will be low and the not column two select signal $\overline{CSEL2}$ will be high. On the other hand, if column two contains the memory cell to be read, the not column two select signal $\overline{CSEL2}$ will be low and the not column one select signal $\overline{CSEL1}$ will be high.

Like transistors Q1 and Q3 the emitters of transistors Q2 and Q4 are coupled together. The collector of transistor Q2 is connected to the read bit line RBL1 of column one, while the collector of transistor Q4 is connected to the read bit line RBL2 of column two.

The bases of transistors Q2 and Q4 are connected to the column decoder 28 and receive the logic signals indicating whether the memory cell to be read is in column one or two, respectively. As shown, the signals are represented by CSEL1 and CSEL2. Thus, if column one contains the memory cell to be read, the column one select line CSEL1 will be held high and the column two select line CSEL2 will be low. On the other hand, if column two contains the memory cell to be read, the column two select line CSEL2 will be held high and the column one select line CSEL1 will be low.

As will be appreciated, transistors Q1 and Q3 cooperatively connect current source 32 to those columns of cells 42 in array 14 that do not include the selected memory cell 42. In contrast, transistors Q2 and Q4 couple current source 32 to the one column in array 14 containing the selected memory cell 42.

Discussing now the current sources 32, current sources 32 include three bipolar transistors Q5, Q6, and Q7. These transistors are connected to resistors R3, R4, and R5, and voltage regulator 34, to form a current source 58 for the unselected columns in array 14, a current source 60 for the selected column in array 14, and a current source 62 for the output stage 20, respectively. These components are selected such that the current $I_{UNSELECT}$ produced by current source 58 is greater than the current $I_{SELECT}$ produced by current source 60.

More particularly, the collector of transistor Q5 is connected to the coupled emitters of transistors Q1 and Q3. Similarly, the collector of transistor Q6 is connected to the coupled emitters of transistors Q2 and Q4. The collector of transistor Q7 is, in turn, connected to the column read access ports 18 and the output stage 20, described in greater detail below. The base of each transistor Q5, Q6, and Q7 is coupled to the regulator 34 and provided with the voltage $V_{BG}$. The emitters of transistors Q5, Q6, and Q7 are connected to a low-voltage reference source $V_{EE}$ by the resistors R3, R4, and R5, respectively. The resistance of these components is selected to provide the desired current source characteristics.

As shown in FIG. 3, the column read access ports 18 include one bipolar transistor Q8 for column one and another bipolar transistor Q9 for column two. More particularly, the base of transistor Q8 is coupled to the read bit line RBL1 of column one, while the base of transistor Q9 is coupled to the read bit line RBL2 of column two. The emitters of the two transistors Q8 and Q9 are coupled together and tied to the collector of output source transistor Q7. The collectors of transistors Q8 and Q9 are, in turn, coupled to the high rail source voltage $V_{CC}$. The bipolar transistors Q8 and Q9 signal data in the column containing the selected memory cell 42 to the output stage 20.

Addressing the output stage 20, as shown in FIG. 3, stage 20 includes a bipolar transistor Q10 having its emitter coupled to the emitters of transistors Q8 and Q9 and to the collector of transistor Q7. This emitter-coupled configuration enhances cell access speed. The base of transistor Q10 is coupled to the threshold circuit 38, described in greater detail below. Finally, the collector of transistor Q10 is coupled to $V_{CC}$ by a resistor R6.

Transistors Q8, Q9, and Q10 compare a voltage level determined in part by the information stored in the select memory cell 42 with the threshold voltage applied to the base of transistor Q10, and set the voltage $V_O$ at the collector of transistor Q10 based upon that comparison.

Figure 4:
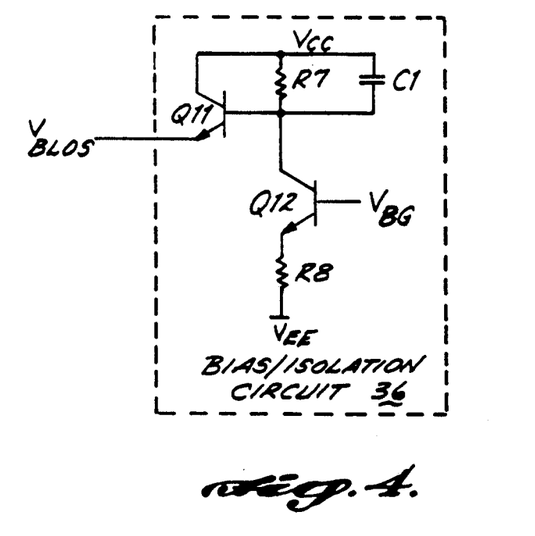
FIG. 4 is a schematic diagram of a bias circuit included in the system of FIG. 1.

Turning now to the details of the bias/isolation circuit 36, as shown in FIG. 4, this circuit produces a voltage $V_{BLOS}$ that is used to bias the read bit lines RBL1 and RBL2 of the columns of array 14. Circuit 36 includes a pair of bipolar transistors Q11 and Q12 coupled in the following manner. The base of transistor Q11 is coupled to the collector of transistor Q12. The collector of transistor Q11 is coupled to its base by the parallel combination of a resistor R7 and capacitor C1. The emitter of transistor Q11 provides the voltage $V_{BLOS}$ to the read bit column lines RBL1 and RBL2 of array 14 at resistors R1 and R2. The emitter of transistor Q12 is coupled to the low rail voltage $V_{EE}$ by a resistor R8. The base of transistor Q12 is coupled to the voltage regulator 34.

As previously noted, circuit 36 generates the offset voltage $V_{BLOS}$ required to properly bias read bit column lines RBL1 and RBL2. Circuit 36 also suppresses noise that might otherwise be passed from the source voltage $V_{CC}$ to the read bit column lines of array 14, affecting the reading of data.

Figure 5:
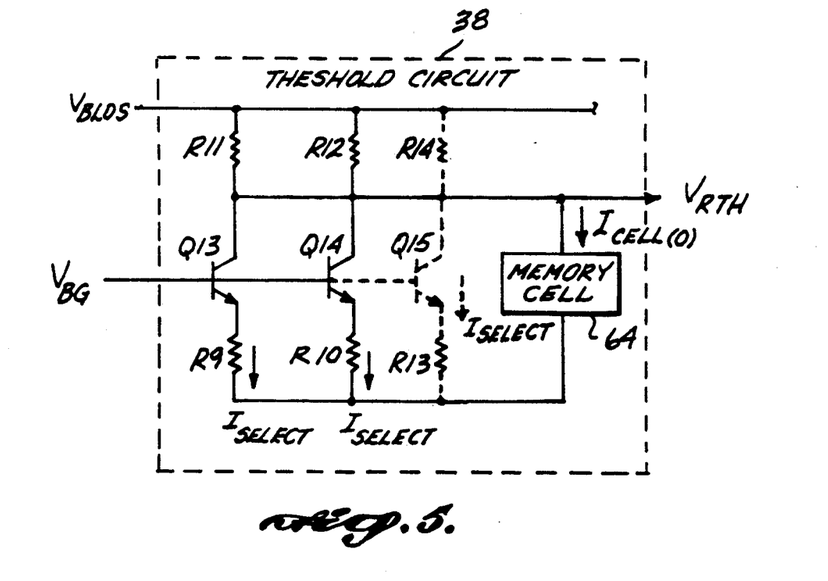
FIG. 5 is a schematic diagram of a threshold circuit included in the system of FIG. 1.

The threshold voltage circuit 38 produces a constant reference voltage $V_{RTH}$ that falls exactly in the middle of the voltage swings experienced on the read bit lines RBL1 and RBL2 of columns one and two when high or low data is applied thereto. To that end, circuit 38 mimics the operation of the select column current source 60 when a zero bit is stored in a select memory cell 42.

As shown in FIG. 5, circuit 38 includes bipolar transistors Q13 and Q14, whose bases are commonly tied to the voltage regulator 34 supply $V_{BG}$. Similarly, the collectors of transistors Q13 and Q14 are coupled together and to a six-transistor reference memory cell 64, which is identical to memory cell 42. The memory cell 64 stores a zero bit and its transistors M4 and M6 are always ON, drawing a current $I_{CELL(0)}$ all the time.

The emitters and collectors of transistors Q13 and Q14 are coupled to emitter resistors R9 and R10 and collector resistors R11 and R12, respectively. The collector resistors R11 and R12 are connected to the bias voltage $V_{BLOS}$, while the emitter resistors R9 and R10 are connected to $V_{EE}$.

With transistors Q13 and Q14 ON, a representation of the current sourced by select current source 60 flows through circuit 38. By mimicking the select current flowing in the memory array 14 in the manner described below, circuit 38 allows the desired threshold level to be obtained. Before describing the operation of circuit 38 in greater detail, however, the read operation is discussed.

To help explain the manner in which information is read from array 14, a brief summary of certain of the voltage levels expected in system 10 is initially provided. Assume the voltage $V_{CC}$ is at ground or zero volts, while the voltages $V_{EE}$ and $V_{SS}$ are at $-5.2$ volts. The voltage $V_{BG}$ output by the voltage regulator $V_{BG}$ is on the order of $-4$ volts. The voltage $V_{BLOS}$ output by the bias/isolation circuit 36 is on the order of $-0.9$ volt.

To read data from a memory cell 42, row decoder 26 applies a high logic signal equal to $V_{CC}$ to the read word line RWL of the row containing that memory cell, while a low logic voltage $V_{EE}$ is applied to the read word RWL when information is not to be read. The voltages applied to the base of the source select multiplexer transistors Q2 and Q4 by column decoder 28 are at a high level designated $V_{CSEL(high)}$ of $-2.4$ volts when the column contains the memory cell selected, and at a low level $V_{CSEL(low)}$ of $-3.0$ volts when the column does not contain the memory cell selected. As will be appreciated, the logic complement applies with respect to source select multiplexer transistors Q1 and Q3.

The voltages that actually appear on the read bit lines RBL1 and RBL2 of the columns in array 14 at nodes n4 and n3 depend on whether the column contains the memory cell to be read, and whether a logic one or logic zero bit of information is stored in the cell selected. The voltage on read bit line RBL1 or RBL2 is greatest when the corresponding column includes the memory cell selected and that memory cell is storing a logic one bit.

In this case, a small current $I_{CELL(1)}$, which is negligible compared to $I_{SELECT}$ and $I_{UNSELECT}$, flows out of the memory cell selected, as discussed below. Thus, the voltage at read bit line RBL1 or RBL2, designated $V_{BL(high)}$, is simply equal to the bias voltage $V_{BLOS}$ minus the voltage drop produced by the select current source 60 across resistors R1 or R2. With resistors R1 and R2 each equal to R0, this can be written in equation form as:

$$V_{BL(high)} = V_{BLOS} - I_{SELECT}R0 \qquad (1)$$

The voltage $V_{BL(high)}$ is greater than the voltage $V_{BL(low/s)}$ produced when a logic zero bit is stored in the selected memory cell. In that case, a small current $I_{CELL(0)}$ flows into the memory cell selected, as discussed below. As a result, the voltage at read bit line RBL1 or RBL2, designated $V_{BL(low/s)}$, is equal to the bias voltage $V_{BLOS}$ minus the voltage drop produced by this current and the current from source 60 across resistor R1 or R2. Written in equation form:

$$V_{BL(low/s)} = V_{BLOS} - (I_{SELECT} + I_{CELL(0)})R0 \qquad (2)$$

As will be appreciated, with the column unselected, the voltage at read bit line RBL1 or RBL2 is simply equal to the bias voltage $V_{BLOS}$ minus the voltage drop produced by the current from the unselect current source 58 across resistors R1 or R2. Thus, $V_{BL(low/u)}$ can be written in equation form as:

$$V_{BL(low/u)} = V_{BLOS} - I_{UNSELECT}R0 \qquad (3)$$

With current sources 58 and 60 designed so that $I_{UNSELECT}$ is greater than or equal to the sum of $I_{SELECT}$ and $I_{CELL(0)}$, $V_{BL(high)}$ is always greater than the voltage $V_{BL(low/u)}$ produced on the read bit lines for unselected columns. Similarly, $V_{BL(low/s)}$ is greater than or equal to $V_{BL(low/u)}$. In that regard, to properly sense a logic zero bit that is stored in a selected memory cell, the bit line voltage $V_{BL(low/u)}$ on all the unselected lines must be lower than or equal to the bit line voltage $V_{BL(low/s)}$ for the zero bit stored on the selected line. Further, as noted above, the threshold voltage $V_{RTH}$ is established halfway between $V_{BL(high)}$ and $V_{BL(low/s)}$.

Discussing now the manner in which sensing circuit 17 reads a zero bit from a selected memory cell, assume that the memory cell selected is memory cell 50. To select cell 50, the bipolar-CMOS row decoder 26 sets the voltage $V_{RWL1}$ on the read word line RWL1 for row one equal to $V_{RWL(high)}$, or $V_{CC}$. In contrast, because cell 50 is not in row two, the voltage $V_{RWL2}$ on the read word line for row two is set at $V_{RWL(low)}$, or $V_{EE}$. Thus, the cell read access port transistor M6 in each cell in row one is switched ON.

To complete the selection of memory cell 50, column one must also be activated. Thus, a high voltage $V_{CSEL(high)}$ is applied to the bases of source select multiplexer transistors Q2 and Q3 as $V_{CSEL1}$ and $V_{\overline{CSEL2}}$. As previously noted, this voltage is on the order of $-2.4$ volts. In contrast, a low voltage $V_{CSEL(low)}$ on the order of $-3.0$ volts is applied to the base of source select multiplexer transistors Q1 and Q4 as $V_{CSEL2}$ and $V_{\overline{CSEL1}}$, respectively.

In the foregoing manner, row decoder 26 causes the transistor M6 in memory cells 50 and 52 in row one to couple stored data to the read bit lines RBL1 and RBL2, respectively. Similarly, the column decoder 28 causes transistors Q2 and Q3 to conduct, while keeping transistors Q1 and Q4 off. As a result, transistor Q2 couples the read bit line RBL1 of column one to the select column current source 60, while transistor Q3 couples the read bit line of column two to the unselected current source 58. With row one and column one enabled, while row two and column two are disabled, only data from cell 50 can be transferred to the output stage 20. As will be appreciated, any memory cell within array 14 can be selected in this manner.

With a zero bit stored in memory cell 50, the read bit line RBL1 for column one is brought low by that bit. As a result, current flows from the read bit line RBL1 through transistors M6 and M4. Thus, the voltage at the base terminal of the column one read access transistor Q8 is equal to the bias voltage $V_{BLOS}$ minus the current drop across resistor R1. As will be appreciated, the current flowing through resistor R1 is equal to the current $I_{CELL(0)}$ flowing into memory cell 50 plus the current $I_{SELECT}$ drawn by the select current source 60. This can be expressed in equation form as:

$$V_{BL1} = V_{BLOS} - (I_{CELL(0)} + I_{SELECT})R1 \qquad (4)$$

As will be appreciated from equation (2), this voltage is equal to $V_{BL(low/s)}$, which is less than $V_{RTH}$.

In contrast, the voltage $V_{BL2}$ at the unselected read bit line RBL2 for column two is equal to the bias voltage $V_{BLOS}$ minus the voltage drop across resistor R2. With the transistors M6 in memory cells 52 and 56 ON and OFF, respectively, the current flowing through resistor R2 is substantially equal to the current $I_{UNSELECT}$ provided by the unselected current source 58. Although a current $I_{CELL(1)}$ will flow out of transistor M6 in memory cell 52 if that cell is storing a logic one bit, $I_{CELL(1)}$ is negligible in comparison to $I_{UNSELECT}$. Thus, regardless of the data stored by the cells in column two, the voltage $V_{BL2}$ on the bit line of column two can be written in equation form as:

$$V_{BL2} \approx V_{BLOS} - I_{UNSELECT}R2 \qquad (5)$$

As will be appreciated from equation (3), this voltage is equal to $V_{BL(low/u)}$, which is less than or equal to $V_{BL(low/s)}$.

At this point, the voltage $V_{BL1}$ present at the base of transistor Q8 is greater than the voltage $V_{BL2}$ present at the base of transistor Q9. Both $V_{BL1}$ and $V_{BL2}$ are, in turn, less than the threshold voltage $V_{RTH}$ applied to the base of output transistor Q10. As a result, the output transistor Q10 turns ON, while the column one and column two read access port transistors Q8 and Q9 are shut OFF. With output transistor Q10 on, the output voltage $V_O$ will be drawn low by the transistor Q10 and output current source 62. Written in equation form, this can be expressed as:

$$V_{O(low)} = V_{CC} - I_{OUT}R6 \qquad (6)$$

With the output voltage $V_O$ low, the zero bit stored in memory cell 50 is effectively sensed.

Now assume that a logic one bit is stored in memory cell 50 for reading by the sensing circuit 17. As will be appreciated, memory cell 50 is again selected from the various cells in the array 14 in the manner described above.

With a logic one bit stored in memory cell 50, transistor M4 is OFF and transistor M3 is ON. In this condition, transistor M6 barely turns ON. More particularly, the gate-to-source voltage $V_{GS}$ of transistor M6 is equal to the high logic signal $V_{RWL(high)}$ received from row decoder 26 minus the signal applied to the read bit line RBL1 of column one by memory cell 50. Written in equation form this can be expressed as:

$$V_{GS} = V_{RWL(high)} - V_{BL1} = V_{RWL(high)} - V_{BL(high)} \qquad (7)$$

As will be appreciated from the preceding remarks, the voltage $V_{RWL(high)}$ is set at $V_{CC}$, while the high logic signal $V_{BL(high)}$ on read bit line RBL1 is equal to the bias voltage $V_{BLOS}$ minus the voltage drop across resistor R1 produced by the select current source 60. Thus, the gate-to-source voltage $V_{GS}$ of equation (7) can be rewritten as:

$$V_{GS} = V_{CC} - (V_{BLOS} - I_{SELECT}R1) \qquad (8)$$

Given the bias voltage $V_{BLOS}$ produced by bias/isolation circuit 36 and setting the product of $I_{SELECT}$ and R1 equal to approximately 0.3 volts, then the gate-to-source voltage $V_{GS}$ is equal to approximately 1.2 volts, which barely turns transistor M6 ON.

In this condition, a current $I_{CELL(1)}$ flows out of cell 50 through transistors M2 and M6 to the read bit line RBL1 of column one. This current $I_{CELL(1)}$ is, however, negligible compared to $I_{SELECT}$ or $I_{UNSELECT}$. The voltage $V_{BL1}$ at the base of the column one read transistor Q8 is then:

$$V_{BL1} = V_{BLOS} - (I_{SELECT} - I_{CELL(1)})R1 \qquad (9)$$
$$\approx V_{BLOS} - (I_{SELECT})R1$$

As will be appreciated from equation (1), the voltage on the read bit line RBL1 of column one is thus $V_{BL(high)}$. As a result, the voltage at the base of the column one read port transistor Q8 is greater than the threshold voltage $V_{RTH}$ applied to the base of output transistor Q10. In response, the read port transistor Q8 turns ON, while the output transistor Q10 turns OFF. In this condition, no current flows through the output resistor R6 and the output voltage $V_O$ is pulled up to the high level $V_{CC}$, indicating that a one bit has been sensed in memory cell 50.

Returning now to a discussion of threshold voltage circuit 38, it mimics the operation of the select current source 60 to produce a voltage $V_{RTH}$ halfway between $V_{BL(high)}$ and $V_{BL(low/s)}$ in the following manner. As will be appreciated from a comparison of equations (1) and (2), the voltage difference between $V_{BL(high)}$ and $V_{BL(low/s)}$ is equal to $I_{CELL(0)}R0$. Thus, the threshold voltage $V_{RTH}$ must be $\frac{1}{2}(I_{CELL(0)}R0)$ above $V_{BL(low/s)}$ and $\frac{1}{2}(I_{CELL(0)}R0)$ below $V_{BL(high)}$.

To that end, the current sources defined by transistor Q13 and resistor R9, as well as transistor Q14 and resistor R10, are each designed to draw a current equal to $I_{SELECT}$. Resistors R11 and R12 are equal to R1 and R2, any of which may be commonly designated R0 for convenience. With R11 and R12 in parallel, their effective resistance is equal to $\frac{1}{2}(R0)$. As will be appreciated from FIG. 5, the threshold voltage $V_{RTH}$ is then equal to $V_{BLOX}$ minus the voltage drop across this parallel combination of R11 and R12. Written in equation form:

$$V_{RTH} = V_{BLOS} - (2I_{SELECT} + I_{CELL(0)})(\tfrac{1}{2})(R0) \qquad (10)$$
$$\approx V_{BLOS} - (I_{SELECT}R0) - \tfrac{1}{2}(I_{CELL(0)}R0)$$

As will be appreciated from equations (1) and (2), $V_{RTH}$ is thus $\frac{1}{2}(I_{CELL(0)}R0)$ above $V_{BL}(low/s)$ and $\frac{1}{2}(I_{CELL(0)}R0)$ below $V_{BL}(high)$, as required.

With $V_{RTH}$ halfway between $V_{BL(high)}$ and $V_{BL(low/s)}$, the changes in the read bit line voltages $V_{BL1}$ and $V_{BL2}$ above and below $V_{BL(low/s)}$ and $V_{BL(high)}$ that are required to switch the output transistor Q10 are equal. As a result, the circuit is self-referencing and provides relatively fast reading of both zero bit and one bit data stored in array 14.

In an alternative embodiment of threshold circuit 38, a third current source, including transistor Q15 and emitter resistor R13, is added to the arrangement of FIG. 5, as shown in dotted line. Another collector resistor R14 is connected in parallel with resistors R11 and R12, reducing the overall resistance of the parallel combination to $\frac{1}{3}(R0)$. Following an analysis similar to that outlined above, the threshold voltage for this arrangement can be expressed as:

$$V_{RTH} = V_{BLOS} - (3I_{SELECT} + I_{CELL(0)})(\tfrac{1}{3})(R0) \qquad (11)$$
$$\approx V_{BLOS} - (I_{SELECT}R0) - \tfrac{1}{3}(I_{CELL(0)}R0)$$

$V_{RTH}$ is now closer to $V_{BL(high)}$ and the voltage on read bit lines RBL1 and RBL2 must rise higher when a logic one bit is sensed in memory array 14, if transistor Q8 or Q9 is to switch ON. Thus, by varying the construction of circuit 38, the relative responsivity of the sensing circuit 17 to logic ones and zeroes can be controlled.

Figure 6:
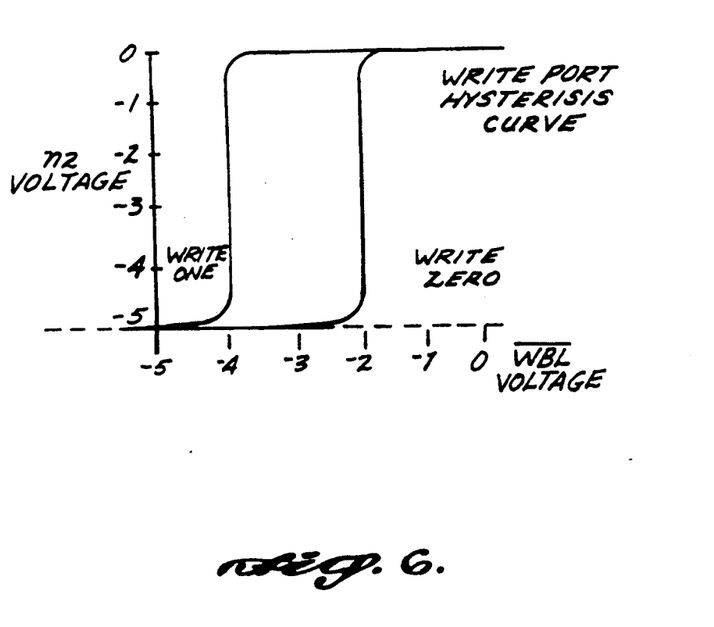
FIG. 6 is a graphic representation of the hysteric operational characteristics of a preferred embodiment of the memory cells of FIG. 3.

Addressing one final feature of system 10, in the preferred embodiment each memory cell 42 of array 14 has an asymmetrical design. With cell 42 operating in this hysteretic manner, the noise margin of the write port is increased preventing noise on the $\overline{WBC}$ from undesirably writing into the unselected cell. More particularly, the sizes of the six transistors M1–M6 are not the same, with the ratio of the channel width of transistor M1 to the channel width of transistor M3 preferably being approximately equal to 0.7. Similarly, the ratio of the channel width of M2 to the channel width of M4 is preferably approximately equal to 0.5. As a result, the read and write operations of the cell 42 are not symmetric and, rather, operate along a hysteresis curve. FIG. 6 shows the voltage n2 of the memory cell 42 operating in a hysteretic manner.

As an example, assume that a logic one is to be written into the memory cell 42 shown in FIG. 2. A logic one is applied to the write word line WWL, and the not write bit line $\overline{WBL}$ signal must fall below $-4$ volts before the logic one is written into memory cell 42.

If a logic zero is now to be written into cell 42, the not write bit line $\overline{WBL}$ must be brought above $-2$ volts. In either case, however, voltages within the curve, such as $-3$ volts, will not be adequate to change the data stored in cell 42. Thus, the not write bit line $\overline{WBL}$ should be biased at $-3$ volts for unselected memory cells residing in the selected write word line in order to avoid writing into unselected cells in the same row. With cell 42 operating in this hysteretic manner, the noise margin of the write port is increased, preventing noise on the not write bit line $\overline{WBL}$ from undesirably writing into the unselected cell.

Summarizing several of the more important features of memory system 10, the column read access ports 18 include a single bipolar transistor for each column in the array. These ports 18, in cooperation with the source select multiplexers 30 and current sources 32, consume a relatively small amount of integrated circuit space while providing a relatively high current yield. The memory array as a whole, on the other hand, consumes a large amount of integrated circuit space and is implemented with CMOS technology. In addition, the threshold circuit 38 allows the system to operate quickly, when self-referencing differential inputs are not employed. Further, the memory cells 42 are asymmetrically designed to increase the integration level and operating speed of the memory.

Those skilled in the art will recognize that the embodiments of the invention disclosed herein are exemplary in nature and that various changes can be made therein without departing from the scope and spirit of the invention. In this regard, and as was previously mentioned, the invention is readily embodied with any number of rows and columns of memory cells in the array. The inclusion of further columns simply requires the revision of the sensing circuit to add additional column read access ports and source select multiplexers. In addition, although the preferred memory cells are illustrated as two-port devices, additional ports can easily be added. For example, five-port CMOS memory cells can be constructed with the addition of three transistors and three bit lines. Because of the above and numerous other variations and modifications that will occur to those skilled in the art, the following claims should not be limited to the embodiments illustrated and discussed herein.

We claim:

1. A bipolar sensing circuit for use in reading information stored in an array of memory cells having read bit lines and read word lines that form a plurality of columns and rows, respectively, said information to be read from a select memory cell that is located in a select column of said array said bipolar sensing circuit comprising:

a plurality of column read transistors having base, collector, and emitter terminals, said base terminals of each of said column read transistors being coupled to a different one of said read bit lines of the memory array;

an output transistor having base, collector, and emitter terminals, said emitter terminal of said output transistor being coupled to said emitter terminal of each of said column read transistors, said column read transistors being for transferring information from a memory cell located at the intersection of one of said read bit lines and one of said read word lines to said output transistor;

current source means for drawing current from said read bit lines of said array, said current source means comprising:

(a) an output source transistor, having base, collector, and emitter terminals, said collector terminal of said output source transistor being coupled to the emitter terminals of said output transistor and said column read transistors;

(b) a select column source transistor, having base, collector, and emitter terminals, said base terminal of said select column source transistor being coupled to said base terminal of said output source transistor; and (c) an unselected column source transistor, having base, collector, and emitter terminals, said base terminal of said unselected column source transistor being coupled to said base terminal of said output source transistor; and source select means for coupling said read bit lines and said column read transistors to said current source means, said collector terminal of said select column source transistor being coupled to said source select means, said collector terminal of said unselected column source transistor being coupled to said source select means.

2. A bipolar sensing circuit for use in reading information stored in an array of memory cells having read bit lines and read word lines that form a plurality of columns and rows, respectively, and wherein information is to be read from a select memory cell that is located in a select column of said array, said bipolar sensing circuit comprising:

a plurality of column read transistors having base, collector, and emitter terminals, said base terminals of each of said column read transistors being coupled to a different one of said read bit lines of the memory array;

an output transistor having base, collector, and emitter terminals, said emitter terminal of said output transistor being coupled to said emitter terminal of each of said column read transistors, said column read transistors being for transferring information from a memory cell located at the intersection of one of said read bit lines and one of said read word lines to said output transistor;

current source means for drawing current from said read bit lines of said array, comprising a;

an output source transistor, having base, collector, and emitter terminals, said collector terminal of said output source transistor being coupled to the emitter terminals of said output transistor and said column read transistors;

a select column source transistor, having base, collector, and emitter terminals, said base terminal of said select column source transistor being coupled to said base terminal of said output source transistor; and an unselected column source transistor, having base, collector, and emitter terminals, said base terminal of said unselected column source transistor being coupled to said base terminal of said output source transistor; and source select means for coupling said read bit lines and said column read transistors to said current source means, said source select means comprising a;

a plurality of column select transistors, having base, collector, and emitter terminals, said emitter terminals of said column select transistors being coupled to said collector terminal of said select column source transistor, said collector terminals of said column select transistors respectively coupled to said base terminals of said column read transistors; and a plurality of column unselected transistors, having base, collector, and emitter terminals, said emitter terminals of said column unselected transistors being coupled to said collector terminal of said unselected column source transistor, said collector terminals of said column unselected transistors respectively coupled to said base terminals of said column read transistors.

3. The bipolar sensing circuit of claim 2, further comprising column bias means for applying a bias voltage to the read bit lines of the array.

4. The bipolar sensing circuit claim 2, further comprising read reference generator means for applying a reference voltage to said base terminal of said output transistor, said reference voltage allowing said output transistor to distinguish the information applied to said base terminal of each said column read transistor.

5. The bipolar sensing circuit of claim 4, wherein a cell read current is produced in said select memory cell and wherein said read reference generator means produces a current dependent upon said cell read current and the current through said select column source transistor to establish said reference voltage.

6. The bipolar sensing circuit of claim 5, wherein said read reference generator comprises:

a pair of reference transistors, having base, collector, and emitter terminals, said base terminals of said reference transistors being coupled together, said collector terminals of said reference transistors being coupled together and to said base terminal of said output transistor;

a pair of collector resistors, each of said collector resistors being coupled to said collector terminal of a different one of each of said reference transistors;

a pair of emitter resistors, each of said emitter resistors being coupled to said emitter terminal of a different one of each of said reference transistors; and a reference memory cell, coupled between said collector terminals of said pair of reference transistors and said pair of emitter resistors.

7. A memory system exhibiting a high memory density and low access time, said memory system comprising:

CMOS memory means, including a plurality of memory cells arranged in an array having a plurality of columns and rows, each of said memory cells having a single data read terminal at which a bit signal stored in said memory cell can be sensed;

a plurality of read bit lines equal in number to the number of columns in said memory array, each of said read bit lines being electrically connected to said data read terminals of an associated column of said memory array; and single-ended bipolar sensing means, coupled to said read bit lines of said memory means, for selectively sensing information stored by said memory means, said bipolar sensing means including:

(a) column access means for coupling said bipolar sensing means to a select read bit line associated with a column of said array in which a select memory cell storing a bit signal to be sensed is located;

(b) output switching means, coupled to said column access means, for switching between states representative of the bit signal stored in said select cell; and (c) level establishment means, coupled to said output switching means, for applying voltage to said output switching means at levels that allow said output switching means to switch states in response to the bit signal stored in said select cell, said level establishment means comprising:

(i) threshold circuit means for applying a threshold voltage to said output switching means; and (ii) current source means for drawing current from said column of said array in which said select memory cell is located and for drawing current from those columns of said array in which said select memory cell is not located, said current source means comprising:

(1) a select column current source for drawing current from only said column of said array in which said select memory cell is located;

(2) an unselected column current source for drawing current from those columns of said array in which said select memory cell is not located; and (3) source select means for coupling said select column current source to only said column in which said select memory cell is located and for coupling said unselected column current source to those columns in which said select memory cell is not located.

* * * * *

UNITED STATES PATENT AND TRADEMARK OFFICE
CERTIFICATE OF CORRECTION

PATENT NO. : 5,179,538
DATED : January 12, 1993
INVENTOR(S) : R. Pang et al.

It is certified that error appears in the above-identified patent and that said Letters Patent is hereby corrected as shown below:

| COLUMN | LINE | |
|---|---|---|
| 3 | 25 | "opertion" should read --operation-- |
| 12 | 12 | "$V_{BLOX}$" should read --$V_{BLOS}$-- |
| 14 (Claim 2 | 51 Line 22) | "comprising a:" should read --comprising:-- |

Signed and Sealed this

Twenty-first Day of December, 1993

Attest:

BRUCE LEHMAN

Attesting Officer       Commissioner of Patents and Trademarks